United States Patent
Gorkhover

(10) Patent No.: US 10,423,082 B2
(45) Date of Patent: Sep. 24, 2019

(54) MICROLITHOGRAPHIC APPARATUS AND METHOD OF CHANGING AN OPTICAL WAVEFRONT IN SUCH AN APPARATUS

(71) Applicant: Carl Zeiss SMT GmbH, Oberkochen (DE)

(72) Inventor: Leonid Gorkhover, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 421 days.

(21) Appl. No.: 14/510,368

(22) Filed: Oct. 9, 2014

(65) Prior Publication Data

US 2015/0022792 A1 Jan. 22, 2015

Related U.S. Application Data

(63) Continuation of application No. PCT/EP2013/001122, filed on Apr. 16, 2013, which
(Continued)

(51) Int. Cl.
*G03B 27/68* (2006.01)
*G03F 7/20* (2006.01)

(52) U.S. Cl.
CPC .......... *G03F 7/70891* (2013.01); *G03F 7/706* (2013.01); *G03F 7/70266* (2013.01);
(Continued)

(58) Field of Classification Search
CPC .. G03F 7/70266; G03F 7/706; G03F 7/70883; G03F 7/70891; G03F 7/70858;
(Continued)

(56) References Cited

U.S. PATENT DOCUMENTS 5,337,097 A * 8/1994 Suzuki ............... G03F 7/70058
353/101
5,883,704 A 3/1999 Nishi et al.
(Continued)

FOREIGN PATENT DOCUMENTS

DE 10000191 11/2004
EP 1113337 7/2001
(Continued)

OTHER PUBLICATIONS

International Search Report for PCT Appl No. PCT/EP2013/001122, dated Aug. 27, 2013.
(Continued)

*Primary Examiner* — Christina A Riddle
(74) *Attorney, Agent, or Firm* — Fish & Richardson P.C.

(57) ABSTRACT

A microlithographic apparatus comprises an optical wavefront manipulator. The latter includes an optical element and a gas-tight cavity that is partly confined by the optical element or contains it. A gas inlet device directs a gas jet towards the optical element. The location, where the gas jet impinges on the optical element after it has passed through the cavity, is variable in response to a control signal supplied by a control unit. A gas outlet is in fluid connection with the vacuum pump so that, upon operation of the vacuum pump, the pressure within the cavity is less than 10 mbar even if the gas jet passes through the cavity.

12 Claims, 6 Drawing Sheets

Related U.S. Application Data is a continuation of application No. PCT/EP2012/001673, filed on Apr. 18, 2012.

(52) U.S. Cl.
CPC ...... *G03F 7/70308* (2013.01); *G03F 7/70316* (2013.01); *G03F 7/70841* (2013.01); *G03F 7/70883* (2013.01)

(58) Field of Classification Search
CPC ............ G03F 7/70908; G03F 7/70916; G03F 7/70925; G03F 7/70933; G03F 7/70841
USPC .. 355/30, 52, 53, 55, 67–71, 72, 73, 75, 76, 355/77; 250/492.1, 492.2, 492.22, 250/492.23, 492.3, 493.1
See application file for complete search history.

(56) References Cited

U.S. PATENT DOCUMENTS

| | | | |
|---|---|---|---|
| 5,995,263 A | 11/1999 | Tokuda et al. | |
| 6,133,577 A * | 10/2000 | Gutowski | B82Y 10/00 250/492.1 |
| 6,338,823 B1 | 1/2002 | Furukawa | |
| 6,583,850 B2 | 6/2003 | Hummel et al. | |
| 6,781,668 B2 | 8/2004 | Schuster et al. | |
| 6,970,228 B1 * | 11/2005 | Aoki | G03F 7/70225 355/30 |
| 7,817,249 B2 | 10/2010 | Uehara | |
| 7,830,611 B2 | 11/2010 | Conradi et al. | |
| 2001/0006412 A1 | 7/2001 | Karl-Heinz et al. | |
| 2001/0019403 A1 | 9/2001 | Schuster et al. | |
| 2004/0051984 A1 * | 3/2004 | Oshino | G03F 7/70891 359/845 |
| 2004/0165161 A1 | 8/2004 | Hara | |
| 2005/0110966 A1 * | 5/2005 | Hasegawa | G03F 7/70891 355/30 |
| 2005/0254029 A1 * | 11/2005 | Banine | G03F 7/70575 355/53 |
| 2008/0073596 A1 | 3/2008 | Derksen et al. | |
| 2009/0257032 A1 | 10/2009 | Eva et al. | |
| 2010/0201958 A1 | 8/2010 | Hauf et al. | |
| 2013/0016331 A1 * | 1/2013 | Exler | G03F 7/70266 355/67 |

FOREIGN PATENT DOCUMENTS

| | | |
|---|---|---|
| EP | 1 376 239 | 1/2004 |
| EP | 1376239 | 1/2004 |
| JP | H8-45827 | 2/1996 |
| JP | H9-50952 | 2/1997 |
| JP | H11-195583 | 7/1999 |
| JP | 2001-196305 | 7/2001 |
| JP | 2001-237180 | 8/2001 |
| JP | 2002-124453 | 4/2002 |
| JP | 2004-039905 | 2/2004 |
| JP | 2004-159778 | 9/2004 |
| JP | 2004-259778 | 9/2004 |
| JP | 5266641 | 8/2013 |
| WO | WO 2006/025408 | 3/2006 |
| WO | WO 2010/034674 A1 | 4/2010 |
| WO | WO 2011/116792 A1 | 9/2011 |
| WO | WO 2013/044936 | 4/2013 |

OTHER PUBLICATIONS

International Search Report for PCT Appl No. PCT/EP2013/001122, dated Jan. 22, 2013.
Japanese Office Action, with translation thereof, for corresponding JP Appl No. 2015-506117, dated Jan. 12, 2017.
Japanese Office Action from App. Ser. No. 2015-506117, dated Nov. 1, 2017, 5 pages (English translation).

* cited by examiner

MICROLITHOGRAPHIC APPARATUS AND METHOD OF CHANGING AN OPTICAL WAVEFRONT IN SUCH AN APPARATUS

CROSS-REFERENCE TO RELATED APPLICATIONS

The present application is a continuation of, and claims benefit under 35 USC 120 to, international application PCT/EP2013/001122, filed Apr. 16, 2013, which claims benefit under 35 USC 120 to international application PCT/EP2012/001673, filed Apr. 18, 2012. The entire disclosure of international application PCT/EP2013/001122 is incorporated by reference herein.

BACKGROUND OF THE INVENTION

1. Field of the Invention

The invention generally relates to the field of microlithography, and in particular to projection exposure apparatus or mask inspection apparatus. The invention is particularly concerned with correcting, or more generally changing, optical wavefronts in such apparatus.

2. Description of Related Art

Microlithography (also referred to as photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultra-violet (DUV), vacuum ultraviolet (VUV) or extreme ultraviolet (EUV) light. Next, the wafer with the photoresist on top is exposed to projection light through a mask in a projection exposure apparatus. The mask contains a circuit pattern to be projected onto the photoresist. After exposure the photoresist is developed to produce an image corresponding to the circuit pattern contained in the mask. Then an etch process transfers the circuit pattern into the thin film stacks on the wafer. Finally, the photoresist is removed. Repetition of this process with different masks results in a multi-layered microstructured component.

A projection exposure apparatus typically includes an illumination system, a mask alignment stage for aligning the mask, a projection objective and a wafer alignment stage for aligning the wafer coated with the photoresist. The illumination system illuminates a field on the mask that may have the shape of a rectangular slit or a narrow ring segment, for example.

In current projection exposure apparatus a distinction can be made between two different types of apparatus. In one type each target portion on the wafer is irradiated by exposing the entire mask pattern onto the target portion in one go; such an apparatus is commonly referred to as a wafer stepper. In the other type of apparatus, which is commonly referred to as a step-and-scan apparatus or simply scanner, each target portion is irradiated by progressively scanning the mask pattern under the projection light beam in a given reference direction while synchronously scanning the substrate parallel or anti-parallel to this direction. The ratio of the velocity of the wafer and the velocity of the mask is equal to the magnification $\beta$ of the projection lens. A typical value for the magnification is $\beta=\pm\frac{1}{4}$.

It is to be understood that the term "mask" (or reticle) is to be interpreted broadly as a patterning means. Commonly used masks contain opaque, transparent or reflective patterns and may be of the binary, alternating phase-shift, attenuated phase-shift or various hybrid mask type, for example.

One of the essential aims in the development of projection exposure apparatus is to be able to lithographically produce structures with smaller and smaller dimensions on the wafer. Small structures lead to high integration densities, which generally has a favorable effect on the performance of the microstructured components produced with the aid of such apparatus. Furthermore, the more devices can be produced on a single wafer, the higher is the throughput of the production process.

The size of the structures that can be generated depends primarily on the resolution of the projection objective being used. Since the resolution of projection objectives is inversely proportional to the wavelength of the projection light, one way of increasing the resolution is to use projection light with shorter and shorter wavelengths. The shortest wavelengths currently used are 248 nm, 193 nm or 157 nm and thus lie in the deep or vacuum ultraviolet spectral range. Also apparatus using EUV light having a wavelength of about 13 nm are meanwhile commercially available. Future apparatus will probably use EUV light having a wavelength as low as 6.9 nm.

The correction of aberrations (i.e. image errors) is becoming increasingly important for projection objectives with very high resolution. Different types of aberrations usually require different correction measures.

The correction of rotationally symmetric aberrations is comparatively straightforward. An aberration is referred to as being rotationally symmetric if the wavefront deformation in the exit pupil of the projection objective is rotationally symmetric. The term wavefront deformation denotes the deviation of an optical wave from the ideal aberration-free wave. Rotationally symmetric aberrations can be corrected, for example, at least partially by moving individual optical elements along the optical axis.

Correction of aberrations that are not rotationally symmetric is more difficult. Such aberrations occur, for example, because lenses and other optical elements heat up rotationally asymmetrically. One aberration of this type is astigmatism.

A major cause for rotationally asymmetric aberrations is a rotationally asymmetric, in particular slit-shaped, illumination of the mask, as it is typically encountered in projection exposure apparatus of the scanner type. The slit-shaped illuminated field causes a non-uniform heating of those optical elements that are arranged in the vicinity of field planes. This heating results in deformations of the optical elements and, in the case of lenses and other elements of the refractive type, in changes of their refractive index. If the materials of refractive optical elements are repeatedly exposed to the high energetic projection light, also permanent material changes are observed. For example, a compaction of the materials exposed to the projection light may occur, and this compaction results in permanent local changes of the refractive index. In the case of mirrors the reflective multi-layer coatings may be damaged by the high local light intensities so that the reflectance is locally altered.

The heat induced deformations, index changes and coating damages alter the optical properties of the optical elements and thus cause aberrations. Heat induced aberrations sometimes have a twofold symmetry. However, aberrations with other symmetries, for example threefold or fivefold, are also frequently observed in projection objectives.

Another major cause for rotationally asymmetric aberrations are certain asymmetric illumination settings in which the pupil plane of the illumination system is illuminated in a rotationally asymmetric manner. Important examples for such settings are dipole settings in which only two poles are illuminated in the pupil plane. With such a dipole setting, also the pupil planes in the projection objective contain two strongly illuminated regions. Consequently, lenses or mirrors arranged in or in the vicinity of such an objective pupil plane are exposed to a rotationally asymmetric intensity distribution which gives rise to rotationally asymmetric aberrations. Also quadrupole settings sometimes produce rotationally asymmetric aberrations, although to a lesser extent than dipole settings.

In order to correct rotationally asymmetric aberrations, U.S. Pat. No. 6,338,823 B1 proposes a lens which can be selectively deformed with the aid of a plurality of actuators distributed along the circumference of the lens. The deformation of the lens is determined such that heat induced aberrations are at least partially corrected.

U.S. Pat. No. 7,830,611 B2 discloses a similar wavefront correction device. In this device one surface of a deformable plate contacts an index matched liquid. If the plate is deformed, the deformation of the surface adjacent the liquid has virtually no optical effect. Thus this device makes it possible to obtain correcting contributions from the deformation not of two, but of only one optical surface. A partial compensation of the correction effect, as it is observed if two surfaces are deformed simultaneously, is thus prevented.

Another way of deforming an optical element, and in particular a thin membrane, is disclosed in U.S. Pat. No. 6,583,850 B2. In one embodiment a cavity is confined by two elliptical membranes. If the gas pressure inside the cavity is changed, the membranes deform in a rotationally asymmetric manner so that a variable astigmatic optical effect is produced.

However, the deformation of optical elements with the help of actuators has various drawbacks. If the actuators are arranged at the circumference of a plate or a lens, it is possible to produce only a restricted variety of deformations with the help of the actuators. This is due to the fact that both the number and also the arrangement of the actuators are fixed. In particular it is usually difficult or even impossible to produce deformations which may be described by higher order Zernike polynomials, such as $Z_{10}$, $Z_{36}$, $Z_{40}$ or $Z_{64}$.

US 2010/0201958 A1 and US 2009/0257032 A1 disclose a wavefront correction device that comprises a refractive optical element formed as a plate. In contrast to the device described in the aforementioned U.S. Pat. No. 7,830,611 B2, a wavefront correction is not produced by deforming the plate, but by changing its refractive index locally. To this end the plate is provided with thin heating wires that extend over one of its surfaces. With the help of the heating wires a temperature distribution inside the plate can be produced that results, via the dependency dn/dT of the refractive index n on the temperature T, in the desired refractive index distribution. Although even higher order wavefront deformations can be corrected very well with this known wavefront correction device, it is necessary to cool the plate simultaneously, for example by guiding a gas flow over one of its surfaces. However, such a gas flow may itself, as a result of small temperature variations, produce schlieren that compromise the desired effect on the optical wavefront.

U.S. Pat. No. 6,781,668 B2 discloses a part of a projection objective towards which a number of cooling gas flows are directed. The orientation of the nozzles from which the gas flows emerge can be changed so that the cooling effect on the lenses can be varied. However, also in this known device a certain amount of schlieren is evitable due to the temperature variations in the atmosphere above the lens surface.

Similar wavefront correction devices using gas flows to cool or heat certain areas of a lens are known from U.S. Pat. Nos. 5,995,263, 5,883,704 and 7,817,249 B2. WO 2011/116792 A1 discloses a wavefront correction device in which a plurality of fluid flows emerging from outlet apertures enter a space through which projection light propagates during operation of the projection exposure apparatus. A temperature controller sets the temperature of the fluid flows individually for each fluid flow. The temperature distribution is determined such that optical path length differences caused by the temperature distribution correct wavefront deformations.

A similar concept is described in the aforementioned U.S. Pat. No. 6,583,850 B2. If the gas pressure in a cavity formed between two rigid optical elements is changed, the index of refraction of the gas changes, too. This can be used to modify the refraction at the optical interfaces that confine the cavity. However, this device has only one degree of freedom and is therefore not capable of correcting higher order wavefront deformations.

From the unpublished international patent application PCT/EP2011/004859 (Zellner et al) a wavefront correction device is known in which a plurality of heating light beams are directed towards a circumferential rim surface of a refractive optical element. After entering the refractive optical element, the heating light beams are partially absorbed inside the element. In this manner almost any arbitrary temperature distribution can be produced inside the refractive optical element, but without a need to arrange heating wires in the projection light path that absorb, reflect, diffract and/or scatter projection light to an albeit small, but not negligible extent.

SUMMARY OF THE INVENTION

It is an object of the present invention to provide a microlithographic apparatus comprising an optical wavefront manipulator that is capable of variable changing an optical wavefront, but in which parasitic effects such as schlieren are significantly reduced.

This object is achieved, in accordance with the present invention, by a microlithographic apparatus comprising a vacuum pump, an illumination system that is configured to produce projection light, and an optical wavefront manipulator. The latter comprises an optical element and a gas tight cavity that is partly confined by the optical element (or contains the optical element) and is arranged in a light path of the projection light. The manipulator further comprises a gas inlet device that is configured to direct a gas jet towards the optical element in order to exchange energy with the optical element and thus to vary the temperature distribution of the latter. A location, where the gas jet impinges on the optical element after it has passed to the cavity, is variable in response to a control signal supplied by a control unit. The optical wavefront manipulator further comprises a gas outlet that is in fluid connection with the vacuum pump so that, upon operation of the vacuum pump, a pressure within the cavity is less than 10 mbar, and preferably less than $10^{-3}$ mbar, even if the gas jet passes through the cavity. The apparatus further comprises a lens which is arranged outside the cavity and through which the projection light passes.

The present invention thus provides an optical wavefront manipulator that is capable of changing the temperature of the optical element at the locations where the gas jet impinges on the optical element. This change of the temperature is caused by the exchange of thermal energy between the gas jet and the optical element. The temperature changes are associated with changes of the refractive index, and thus an optical wavefront passing through the optical element is subjected to phase variations that result in a desired change of the optical wavefront.

The invention is based on the perception that schlieren and other problems associated with gas flows passing through a dense atmosphere are eliminated if a vacuum is produced through which the gas flow passes on its way towards the optical element. Even if the density of the gas particles in the gas jet is as high as $10^{15}$ cm$^{-3}$, for example, the density changes, and thus the changes of the refractive index, are very small in relative terms. In other words, the refractive index of the vacuum and the refractive index of the gas jet differ only by a very small amount. Thus the gas jet as such has only a negligible impact on the optical wavefronts.

Another positive effect of the vacuum is that the optical element is in fact thermally isolated because there is no surrounding atmosphere which is able to remove heat by heat conduction or convection. Since the coefficient of thermal conduction of many optical materials such as fused silica is small, heat can be exchanged with the optical element primarily by heat radiation, which is a comparatively weak effect at least for temperatures that typically occur in microlithographic apparatus. This thermal isolation has the advantage that any local change of the temperature produced with the help of the gas jets is maintained over a long time. For that reason only a small heat exchange at the locations, where the gas jet impinges on the optical element, suffices to maintain a certain temperature distribution.

If the optical element is a refractive optical element, in particular a lens or a plane parallel plate, that is arranged in an objective of the apparatus that images a mask on a surface, it is possible to arrange the optical element at almost any arbitrary optical position, and in particular in a pupil plane. In one embodiment the cavity is confined by two optical elements, wherein one or two of the optical elements are formed by a plane parallel plate or a lens. However, also combinations of a refractive optical element and a reflective optical element may be used to confine the cavity. If the gas jet is then directed on the refractive optical element, this has the advantage that the optical wavefront passes, after it has been reflected by the reflective optical element, a second time through the refractive optical element so that the induced phase difference also doubles. If the optical element on which the gas jet impinges is a mirror, the temperature changes result in small deformations of the mirror surface, which produce the desired changes of the optical wavefront.

However, it is also possible to direct the gas jet on an optical element which is contained in the gas-tight cavity, but does not confine it. In the case of a refractive optical element this has the advantage that both sides of the element are thermally isolated by the vacuum.

In that case it is even possible to use a mask, which is imaged by the objective on a surface, as the optical element on which a gas jet is directed by the gas inlet device. Also a mask stage configured to displace the mask may be arranged inside the cavity. However, the objective and the illumination system are not arranged inside the cavity.

With the mask being the optical element on which gas flows are directed, distortion and other field dependent aberrations can be corrected very efficiently.

The arrangement of the quickly moving mask in the vacuum prevailing in the cavity has the further advantage that no gas turbulences occur, as they may be observed in conventional apparatus of this kind There portions of a surrounding gas usually contact heated surfaces, for example the mask surface or the first lens of the objective, and heat up to some degree. This results in a local change of the refractive index of the gas. The quick movements of the mask stir the gas, and thus the resulting turbulences of the gas may be accompanied by quickly changing schlieren.In order to be able to vary the location where the gas jet impinges on the optical element, the gas inlet device may comprise a nozzle and an actuator configured to change the position and/or the orientation of the nozzle in response to the control signal. For example, if the nozzle is displaced along a direction which does not coincide with an optical axis of the optical element, or is tilted by a certain angle, the gas jet will impinge at a different location on the optical element, and thus the temperature change is produced somewhere else. By quickly changing the position and/or orientation of the nozzle it is thus possible to produce over a certain time period almost any arbitrary temperature distribution in the optical element.

Another manner of varying the location where the gas jet impinges on the optical element is to provide a gas inlet device which comprises a plurality of nozzles and a plurality of flow rate control devices. Each flow rate control device is associated with one of the nozzles and is configured to control the amount of gas that passes through the flow rate control device. For example, there may be a plurality of nozzles which are arranged along a circumference of the cavity so that the gas jet produced by each nozzle is able to impinge at a certain location on the optical element. If then certain gas jets are switched on and off with the help of the flow rate control devices, different locations on the optical element will be subjected to gas jets.

If the gas inlet device is configured to emit at least one supersonic free jet, the particles in the jet will have parallel and linear trajectories with minimum heat movements (oscillations and rotations). Such a supersonic free jet does not significantly diverge, and thus very small areas on the optical element can be selectively exposed to the gas jet.

A type of nozzle which is particularly suitable to produce a supersonic free jet is a Laval nozzle.

The objective may be used in a mask inspection apparatus or in a projection exposure apparatus, for example. In the latter case the projection exposure apparatus may comprise a light source configured to produce a train of successive light pulses.

In that case the gas inlet device may be configured to produce a train of successive gas jets that is interleaved with the train of light pulses produced by the light source in such a way that no light pulse impinges on any of the gas jets. Particularly if the gas jets are ultrasonic free jets, the time needed for the gas particles to get from the gas inlet device to the gas outlet is so short that the process of injecting a gas jet and to collect the gas particles at the gas outlet can be performed during the intervals between two successive light pulses of a pulse train produced by the light source. Then the projection light pulses will never impinge on any of the gas jets, and consequently the latter can have no adverse impact on the optical wavefront.

Subject of the present invention is also a method of changing an optical wavefront in a microlithographic apparatus. The method in accordance with the present invention comprises the following steps:

a) providing an optical element, a gas-tight cavity that is partly confined by the optical element or contains the optical element, the cavity being arranged in a light path of projection light, and a lens that is arranged outside the cavity and through which projection light passes;

b) producing a vacuum in the cavity;

c) injecting a gas into the cavity so as to produce a gas jet that is directed towards the optical element.

Subject of the invention is also a microlithographic apparatus comprising an optical element, a cavity confined by the optical element or containing the optical element, a vacuum pump connected to the cavity, a lens arranged outside the cavity, and a gas inlet device configured to produce a gas jet that propagates through the cavity and impinges on the optical element, wherein the gas inlet device is configured to vary the locations where the gas jet impinges on the optical element.

Subject of the invention is also a microlithographic apparatus comprising an illumination system that is configured to illuminate a mask, an objective configured to image the mask on a surface and containing at least one lens through which projection light passes, a cavity containing the mask but not the illumination system and the objective, and a vacuum pump connected to the cavity. The vacuum pump may be configured so that, upon operation of the vacuum pump, a pressure within the cavity is less than 10 mbar. Also a mask stage that is configured to displace the mask may be arranged inside the cavity.

Definitions

The term "light" denotes any electromagnetic radiation, in particular visible light, UV, DUV and VUV light.

The term "light ray" is used herein to denote light whose path of propagation can be described by a line.

The term "light beam" is used herein to denote a plurality of light rays. A light beam usually has an irradiance profile across its diameter that may vary along the propagation path. A single light beam can usually be associated with a single point or extended light source.

The term "surface" is used herein to denote any planar or curved surface in the three-dimensional space. The surface may be part of a body or may be completely separated therefrom.

The term "refractive optical element" is used herein to denote an optical element that is transparent at least for the projection light. Furthermore, the element has at least one optical surface through which the projection light enters the element. Usually the projection light will be refracted at this optical surface.

The term "optically conjugate" is used herein to denote an imaging relationship between two points or two surfaces. Imaging relationship means that a light bundle emerging from a point converges at the optically conjugate point.

The term "field plane" is used herein to denote a plane that is optically conjugate to the mask plane.

The term "pupil plane" is used herein to denote a plane in which all light rays, which converge or diverge under the same angle in a field plane, pass through the same point. As usual in the art, the term "pupil plane" is also used if it is in fact not a plane in the mathematical sense, but is slightly curved so that, in a strict sense, it should be referred to as pupil surface.

BRIEF DESCRIPTION OF THE DRAWINGS

Various features and advantages of the present invention may be more readily understood with reference to the following detailed description taken in conjunction with the accompanying drawings in which.

DESCRIPTION OF PREFERRED EMBODIMENTS

I.

General Construction of Projection Exposure Apparatus

Figure 1:
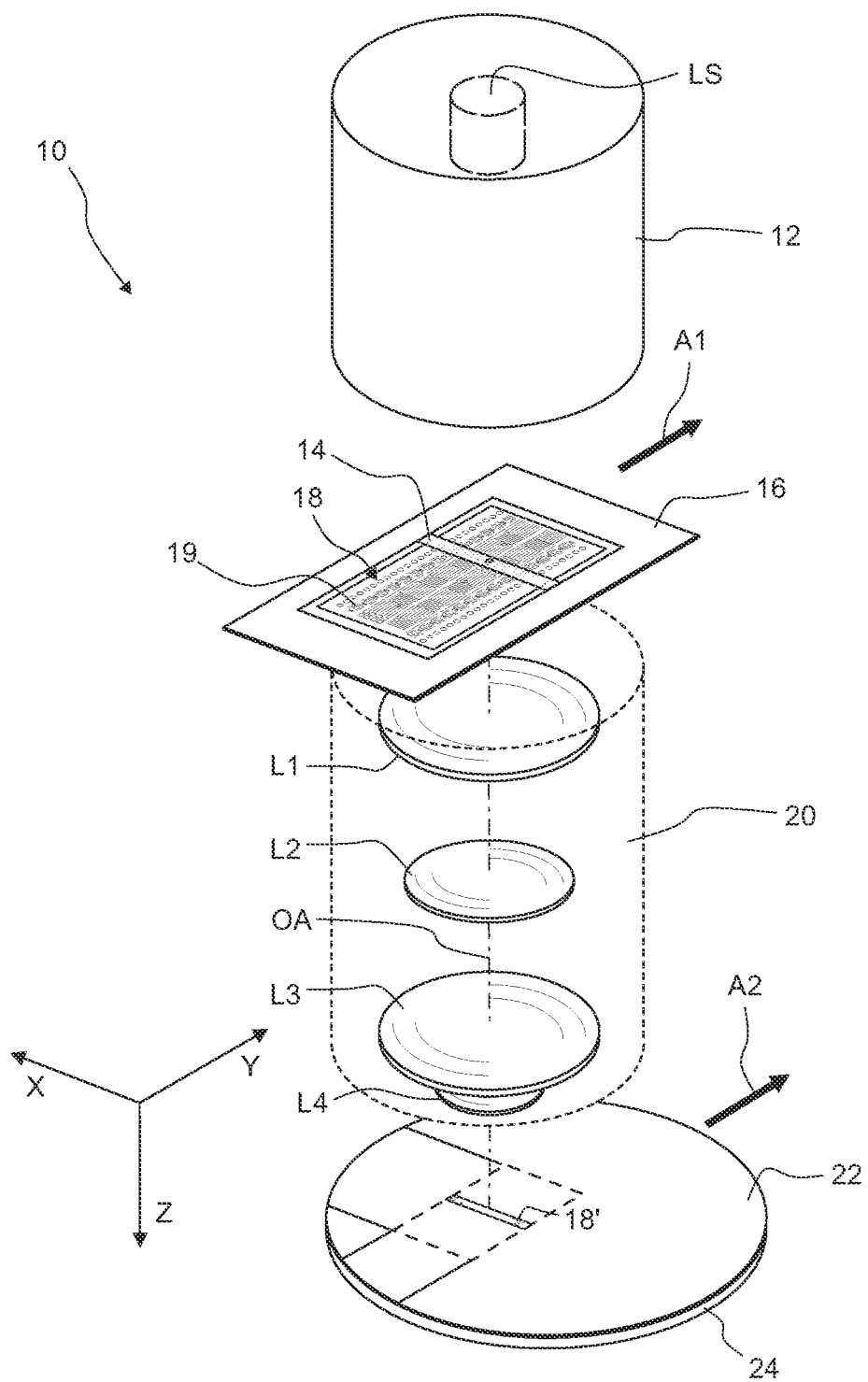
FIG. 1 is a schematic perspective view of a projection exposure apparatus in accordance with the present invention.

FIG. 1 is a perspective and simplified view of a projection exposure apparatus 10 in accordance with the present invention. The apparatus 10 comprises an illumination system 12 containing a light source LS which produces projection light having a central wave-length of 193 nm. The projection light illuminates a field 14 on a mask 16 containing a pattern 18 of fine features 19. In this embodiment the illuminated field 14 has a rectangular shape. However, other shapes of the illuminated field 14, for example ring segments, and also other operating wavelengths, for example 157 nm or 248 nm, are contemplated as well.

A projection objective 20 having an optical axis OA and containing a plurality of lenses L1 to L4 images the pattern 18 within the illuminated field 14 onto a light sensitive layer 22, for example a photoresist, which is supported by a substrate 24. The substrate 24, which may be formed by a silicon wafer, is arranged on a wafer stage (not shown in FIG. 1) such that a top surface of the light sensitive layer 22 is precisely located in an image plane of the projection objective 20. The mask 16 is positioned via a mask stage (not shown in FIG. 1) in an object plane of the projection objective 20. Since the latter has a magnification β with |β|<1, a minified image 18' of the pattern 18 within the illuminated field 14 is projected onto the light sensitive layer 22.

During the projection the mask 16 and the substrate 24 move along a scan direction which corresponds to the Y direction indicated in FIG. 1. The illuminated field 14 then scans over the mask 16 so that patterned areas larger than the illuminated field 14 can be continuously imaged. The ratio between the velocities of the substrate 24 and the mask 16 is equal to the magnification β of the projection objective 20. If the projection objective 20 does not invert the image (β>0), the mask 16 and the substrate 24 move along the same direction, as this is indicated in FIG. 1 by arrows A1 and A2. However, the present invention may also be used with catadioptric projection objectives 20 having off-axis object and image fields, and with apparatus of the step-and-scan type in which the mask 16 and the substrate 24 do not move during the projection.

Figure 2:
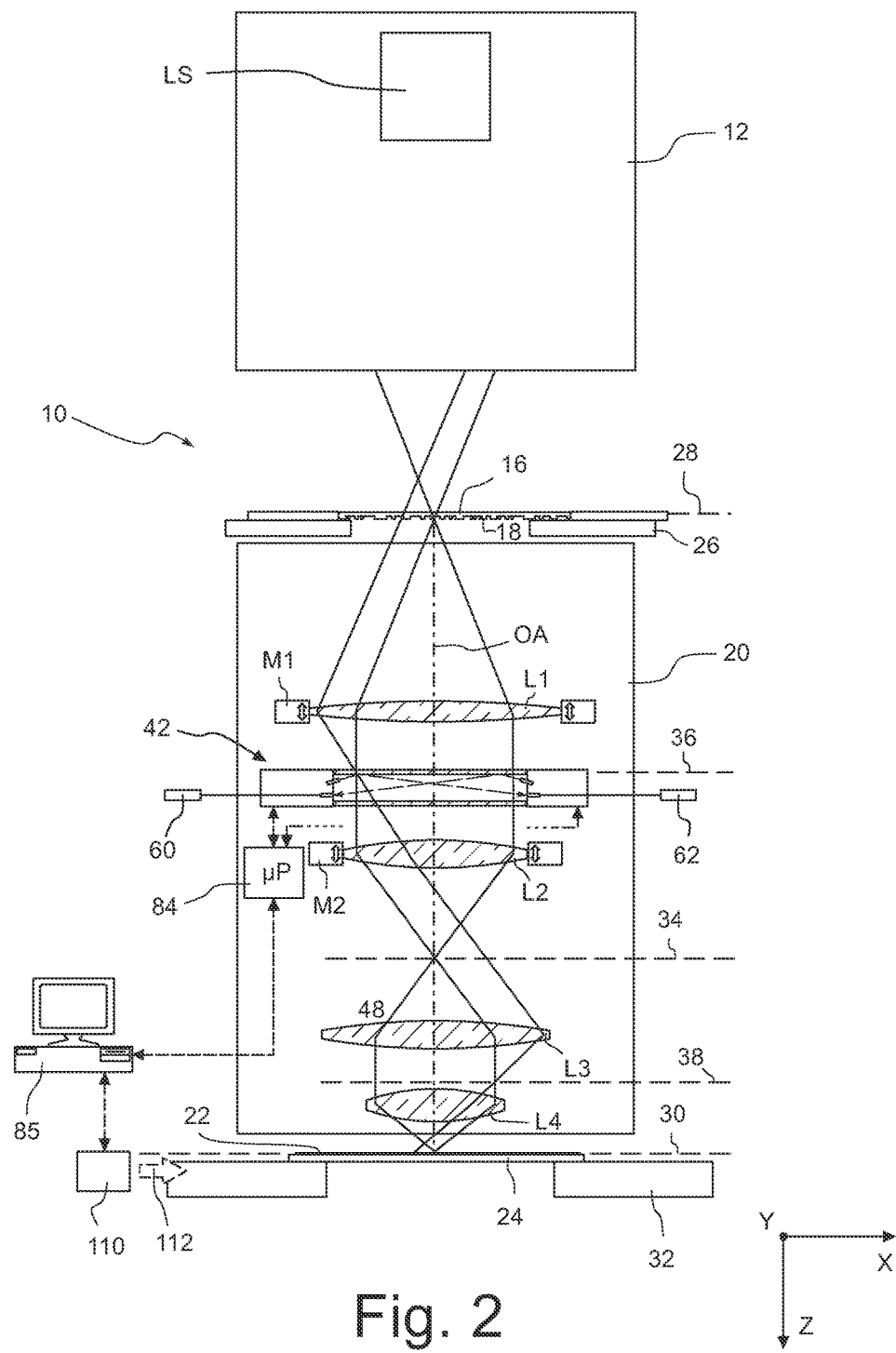
FIG. 2 is a schematic meridional section through the apparatus shown in FIG. 1.

FIG. 2 is a schematic meridional section through the apparatus 10 shown in FIG. 1. In this section also the mask stage denoted by 26, which supports and moves the mask 16 in the object plane 28 of the projection objective 20, and the wafer stage denoted by 32, which supports and moves the substrate 24 in the image plane 30 of the projection objective 20, are schematically illustrated.

Inside the projection objective 20 two manipulators M1 and M2 are arranged that are configured to individually displace the lenses L1 and L2, respectively, along an optical axis OA of the projection objective 20.

In this embodiment the projection objective 20 has an intermediate image plane 34. A first pupil plane 36 is located between the object plane 28 and the intermediate image plane 34, and a second pupil plane 38 is located between the intermediate image plane 34 and the image plane 30 of the projection objective 20. In the first and second pupil plane 36, 38 all light rays converging or diverging under the same angle from any of the field planes, i.e. the object plane 28, the intermediate image plane 34 and the image plane 30, pass through the same point, as this is illustrated in FIG. 2.

In the first pupil plane 36 an optical wavefront manipulator 42 for correcting, or more generally changing, wavefront deformations is arranged. The optical wavefront manipulator 42 will be described in more detail in the following section.

II.

Wavefront Manipulator

Figure 3:
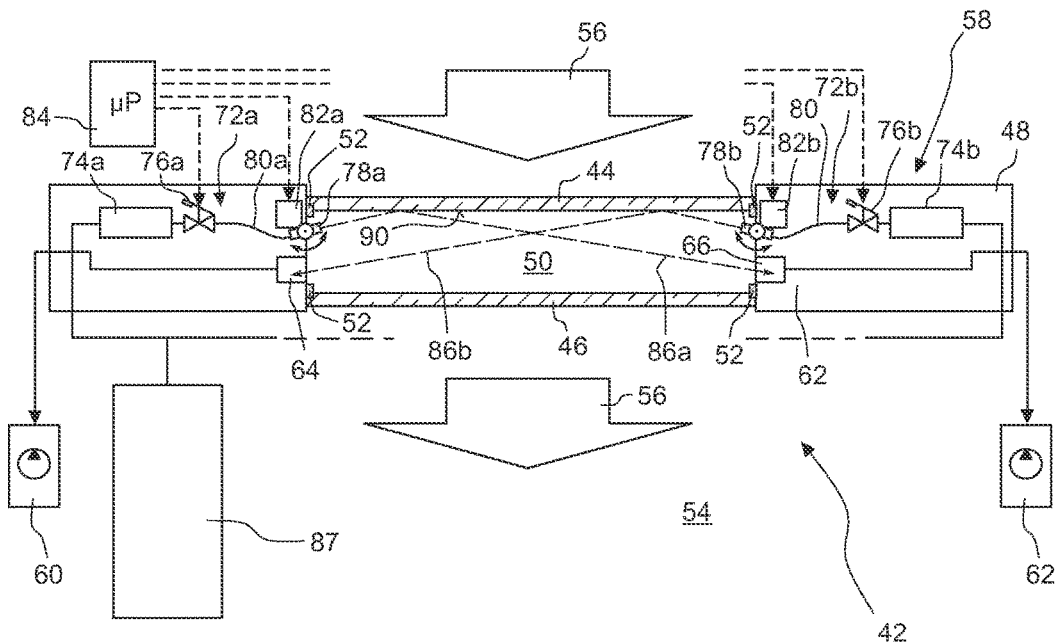
FIG. 3 is an enlarged and highly schematic meridional section through the optical wavefront manipulator contained apparatus of FIG. 2.

FIG. 3 is an enlarged and highly schematic meridional section through the optical wavefront manipulator 42 shown in FIG. 2.

The optical wavefront manipulator 42 comprises two optical elements that are formed in this embodiment by a first plate 44 and a second plate 46. Each plate 44, 46 has two plane and parallel surfaces and a square contour. The two plates 44, 46 confine, together with a housing structure 48, a gas-tight cavity 50. Seals 52 are provided at the interfaces between the plates 44, 46 on the one hand and the housing structure 48 on the other hand so as to ensure that virtually no exchange of gas particles occurs between the cavity 50 and the outer atmosphere 54 surrounding the optical wavefront manipulator 42. This outer atmosphere may consist of a purge gas such as $N_2$ or an inert gas at room temperature (22° C.) and standard pressure (1 bar), for example. The projection objective 20 comprises a conditioning unit (not shown) that maintains the atmosphere 54 inside the projection objective 20 at these conditions.

The plates 44, 46 are transparent for projection light indicated by arrows 56 in FIG. 3. Fused silica is a suitable material for the plates 44, 46 since it has a small coefficient of thermal conduction which, as it will turn out further below, has a favorable impact on the function of the optical wavefront manipulator 42.

In the embodiment shown the plates 44, 46 have identical dimensions. However, the plates 44, 46 may also have different dimensions, and other refractive optical elements such as lenses may be used instead of the plates 44, 46 as optical elements. In a projection objective 20 of the catadioptric type it may also be envisaged to replace one of the plates 44, 46, and in particular the second plate 46, by a mirror.

The housing structure 48 confining and surrounding the cavity 50 accommodates a gas inlet device denoted generally by 58, and two gas outlets 64, 66 each being in fluid connection with a vacuum pump 60, 62 which are arranged outside the projection objective 20 and are vibrationally isolated therefrom.

The gas inlet device 58 is configured to direct one or more gas jets towards the first plate 44. To this end the gas inlet device 58 comprises a plurality of inlet units. In the meridional section shown in FIG. 3, only two of these inlet units are shown and denoted by 72a and 72b. Further inlet units may be arranged at other circumferential positions of the optical wavefront manipulator 42.

The first inlet unit 72a comprises a pressure chamber 74a, a valve 76a, a movable Laval nozzle 78a and a flexible tube 80a which connects the valve 76a to the Laval nozzle 78a. The Laval nozzle 78a is mounted in an articulated manner and is connected to an actuator 82a which is configured to change the orientation of the Laval nozzle 78a in response to a control signal received from a control unit 84. The latter communicates with an overall system control 85, which is represented in FIG. 2 as personal computer. As schematically illustrated by a double arrow in FIG. 3, the Laval nozzle 78a is thus able to rotate around at least one rotational axis so that the direction of a gas jet 86a emitted by the Laval nozzle 78a can be varied with the help of the actuator 82a.

The second inlet unit 72b has an identical construction. It thus comprises a pressure chamber 74b, a valve 76b, a Laval nozzle 78b, a flexible tube 80b and an actuator 82b for changing the orientation of the Laval nozzle 78b.

The pressure chambers 74a, 74b of the inlet units 72a and 72b, respectively, are connected to a common gas feed unit 87 which serves to provide a gas, for example an inert gas such as argon, having a predetermined temperature (for example 22° C.) and a certain pressure, for example a pressure between 50 mbar and 5 bar.

III.

Function

In the following it will be described how the optical wavefront manipulator 42 may be operated to change the optical wavefront of projection light 56 passing through it.

Before projection light 56 is allowed to pass through the optical wavefront manipulator 42, a vacuum is created in the cavity 50 with the help of the vacuum pumps 60, 62. The pressure inside the cavity 50 should be reduced to less than 10 mbar and preferably less than $10^{-3}$ mbar. Then the valves 76a, 76b are opened so that gas contained in the pressure chambers 74a, 74b is allowed to enter the cavity 50. Due to the great pressure difference between the pressure chambers 74a, 74b on the one hand and the vacuum in the cavity 50, gas flowing through the Laval nozzles 78a, 78b is supersonically expanded to produce the free gas jets 86a, 86b. As a result of this supersonic expansion, the collision frequency between the gas particles is greatly reduced, while the velocity of the gas particles is increased significantly. The thermal movement of the gas particles is also reduced so that the temperature of the gas jets 86a, 86b may be in the order of a few K only. Since all gas particles move with approximately the same (high) velocity, but do not collide with each other, the gas jets 86a, 86b have a very small diameter which does not increase significantly along the propagation direction. The diameter of the gas jets 86a, 86b is mainly determined by the inner diameter of the Laval nozzles 78a, 78b and may be as small as 1 mm.

The gas jets 86a, 86b emitted from the Laval nozzles 78a, 78b pass through the cavity 50 and then impinge on the inner surface 90 of the first plate 44. There the gas particles interact with the atoms at the inner surface 90 of the first plate 44. This interaction results in a heat exchange between the gas particles and the first plate 44 at the locations where the gas jets impinge on the first plate 44. Whether the gas jets 86a, 86b have a heating or cooling effect at these locations depends on various parameters, including the composition of the gas, the properties of the inner surface 90 of the first plate 44, the pressure difference between the pressure chambers 74a, 74b and the cavity 50, and also on the angle under which the gas jets 86a, 86b impinge on the inner surface 90 of the first plate 44.

The gas jets impinge, after reflection at the inner surface 90 of the first plate 44, on one of the lateral surfaces confining the cavity 50, and preferably enter directly one of the gas outlets 64, 66 connected to the vacuum pumps 60, 62. Generally it should be avoided that the gas jets 86a, 86b impinge, after interaction with the first plate 44, on the second plate 46 because this may result in an additional, but this time undesired, exchange of heat between the gas jets 86a, 86b and the second plate 46.

The locally restricted exchange of heat between the gas jets 86a, 86b and the first plate 44 modifies the temperature distribution in the first plate 44. This modified temperature distribution is directly associated, via the dependence dn/dT of the refractive index n of the first plate 44 on the temperature T, with a modified distribution of the refractive index n. Hence also the phase distribution of an optical wavefront passing through the first plate 44 is modified. In this manner undesired deformations of the optical wavefront can be reduced or changed in such a manner that the wavefront deformations can be reduced more easily with other manipulators provided in the projection objective 20, for example the manipulators M1 and M2 that displace the lenses L1, L2 along the optical axis OA.

It should be noted that, although the heat exchange between the gas jets 86a, 86b and the first plate 44 may be small, it will usually suffice to change the temperature in the first plate 44 locally. This is due to the fact that the cavity 50 does not contain any substantial amounts of gas that could help to remove heat from or add heat to the first plate 44 by heat conduction or convection. Thus heat at the inner surface 90 of the first plate 44 can only be removed by radiation or thermal conduction inside the first plate 44. However, at least for certain materials such as fused silica, the coefficient of thermal conduction is quite small. Therefore a modification of the temperature distribution in the first plate 44 produced by the gas jets 86a, 86b is maintained over a relatively long time. Put another way, even a small heat exchange suffices to produce a substantially stable temperature distribution in the first plate 44.

Figure 4:
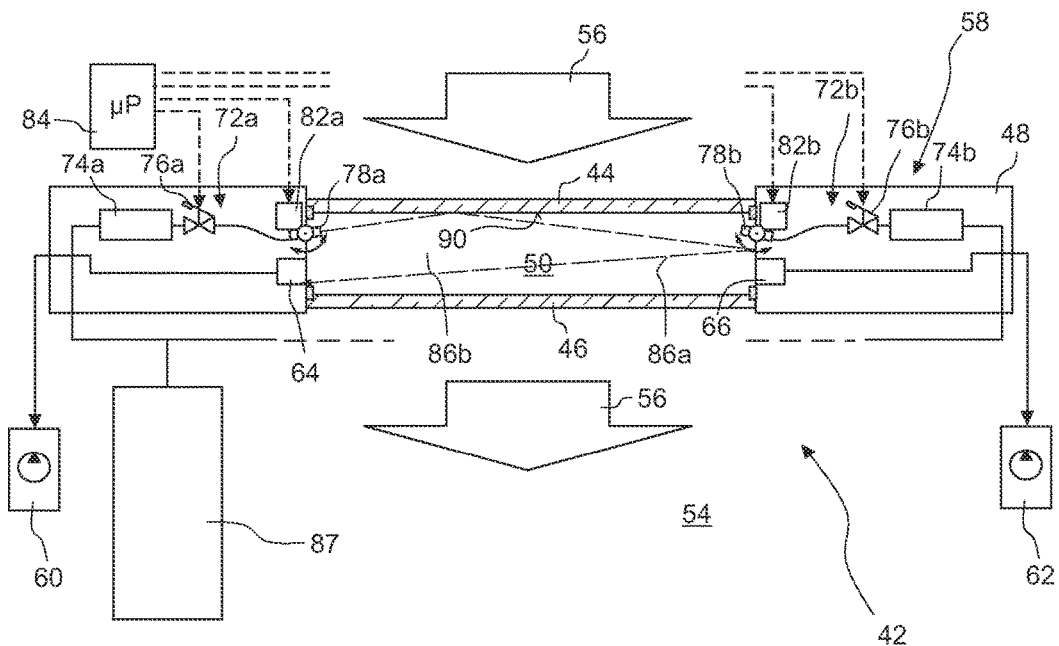
FIG. 4 shows the optical wavefront manipulator of FIG. 3 at a later time when only one gas jet impinges at a different location on a glass plate.

Various parameters, in particular the throughput through the valves 76a, 76b and the orientation of the Laval nozzles 78a, 78b, can be used to vary the effect of the optical wavefront manipulator 42 on the optical wavefront. FIG. 4 illustrates the case in which the valve 86b has been closed and the Laval 1 nozzle 78a has been tilted so that only one gas jet 86a passes impinges on the first plate 44, but now at a different location as compared to the configuration shown in FIG. 3. By moving the gas jets 86a, 86b continuously or intermittently over the inner surface 90 of the first plate 44, almost any temperature distribution within a certain temperature range can be produced.

In order to be able to direct gas jets 86a, 86b to almost any arbitrary location on the first plate 44, it may be envisaged to use actuators that are capable to displace the Laval nozzles 78a, 78b also translationally, i.e. along straight or curved lines.

In this embodiment the second plate 46 does not contribute to the correction of wavefront deformations. As a matter of course, additional inlet units may be provided that direct gas jets on the second plate 46. If very sophisticated control schemes are applied, it is even possible to direct the gas jets 86a, 86b on the first plate 44 such that they are reflected towards the second plate so that each gas jet 86a, 86b interacts twice. The desired modification of the optical wavefront has then to be distributed among the two plates 44, 46, but with the additional constraint that the temperature distribution in the second plate 46 cannot be determined independent from the temperature distribution in the first plate 44.

The density of the gas particles in the gas jets 84a, 84b may be so small that the refractive index of the gas jets 86a, 86b does not differ substantially from those portions of the cavity 50 through which no gas jet passes. Thus the gas jets 86a, 86b as such have virtually no impact on the optical wavefront of the projection light.

Figure 5:
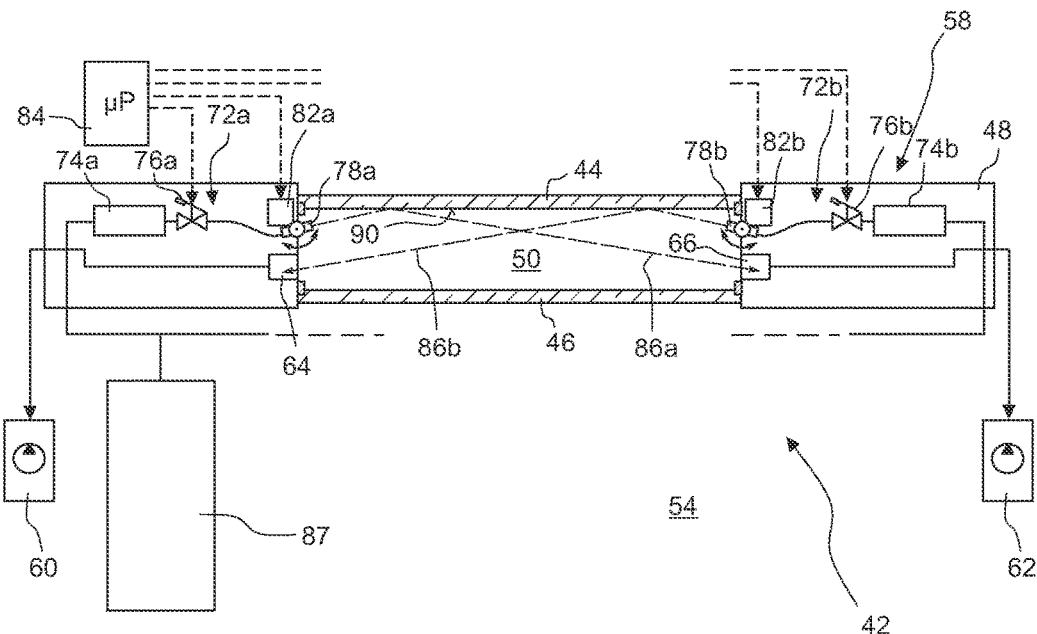
FIG. 5 shows, in a meridional section similar to FIGS. 3 and 4, the optical wavefront manipulator in a state when no light pulse propagates through the manipulator.
Figure 6:
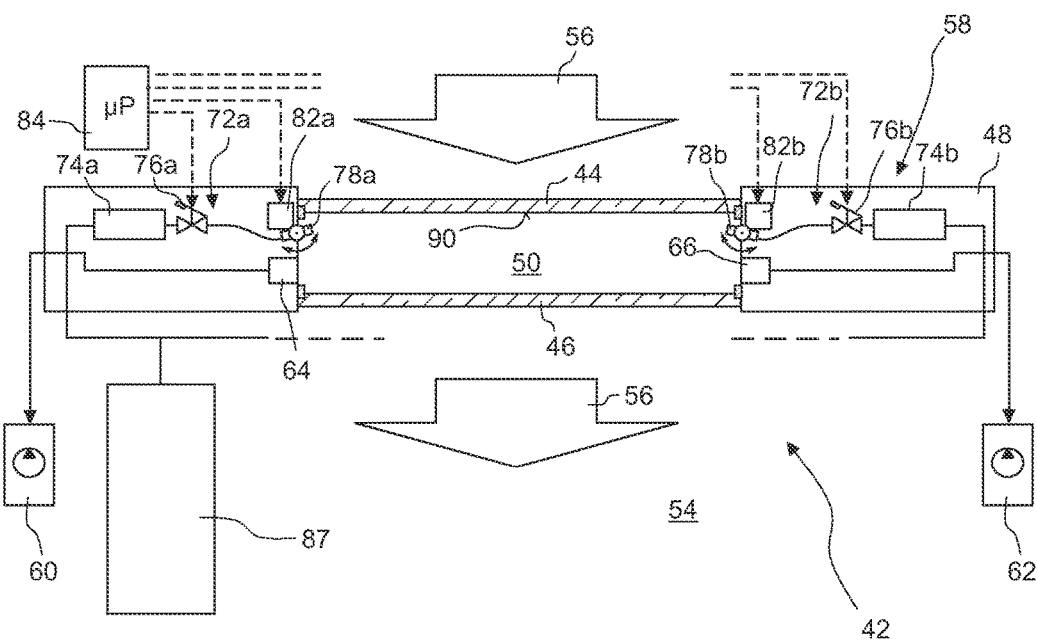
FIG. 6 shows, in a meridional section similar to FIGS. 3 and 4, the optical wavefront manipulator in a state when a light pulse propagates through the manipulator.

However, if, for whatever reason, all possible interactions of the projection light 56 with the gas jets 86a, 86b shall be prevented, the latter may be produced only during times at which no projection light 56 passes through the optical wavefront manipulator 42, as this is shown in FIG. 5. Since the gas jets 86a, 86b propagate with ultrasonic velocities and are thus very fast, even the short intervals between successive scan operations will suffice to emit a short gas jet pulse by the Laval nozzles 78a, 78b and to remove the gas jets from the cavity 50 after they have interacted with the first plate 44, but before projection light (see FIG. 6) again passes through the cavity 50. If the valves 76a, 76b are controlled such that the gas jet pulses are sufficiently short, it is even possible to emit the gas jet pulses during the time intervals between successive light pulses of a single scan cycle. This exploits that fact that usually the light source LS contained in a projection exposure apparatus emits a train of light pulses with a pulse frequency of a few kHz. Then a train of successive gas jets 86a, 86b can be interleaved with the train of light pulses produced by the light source LA such that no light pulse impinges on any of the gas jets 86a, 86b. The conditions shown in FIGS. 5 and 6 then alternate very quickly and synchronous with the pulse frequency.

IV.

Correction Method

In the following it will be described how the optical wavefront manipulator 42 may be used to correct wavefront deformations.

In a first step an aberration of the projection objective 20 is determined. This can be done either by measurements and/or by simulation. Simulation may be performed on the basis of experimental data and has the advantage that the operation of the projection exposure apparatus does not have to be disrupted to perform measurements of the image quality, for example. Simulation will usually be involved also if image enhancement technologies are applied. Determining an aberration by measurement, on the other hand, may be necessary if the aberration shall be determined with the highest possible accuracy. For measuring the aberration, an optical wavefront measuring device 110, for example a Fizeau interferometer, may be inserted into the image plane 30 of the projection objective 20, as this is indicated in FIG. 2 by an arrow 112.

Also a mixed approach, which uses certain measurements as well as simulations, may be used to quickly and accurately determine the aberration. For example, an ideal non-planar wavefront may be computed using image enhancement technologies, and the real optical wavefront is measured.

In a next step the corrective effect which is required to obtain the desired optical wavefront has to be determined. This step may also take into account that not only the optical wavefront manipulator 42, but also other correction systems, for example the manipulators M1, M2 which are configured to displace the lenses L1, L2 along the optical axis OA, are available to reduce the aberration. One approach is to consider all available correction systems in a common optimization process. Singular value decomposition (SVD) or Tikhonov regularization may be used in this respect. Another approach based on Convex Programming is described in WO 2010/034674 A1. In such an optimization process the first plate 44 may be conceptionally divided into a plurality of pixels that correspond to locations where the gas jets 86a, 86b may impinge on the first plate 44.

The optimization process yields a phase variation which is to be generated by the first plate 44. If the projection objective 20 comprises other correction devices (such as the manipulators M1, M2) having a rotationally symmetric impact on the optical wavefront, the phase generation to be generated by the first plate 44 will, at least generally, be rotationally asymmetric in such a way that the optical wavefront becomes rotationally symmetric. This implies that the coefficients of higher order Zernike polynomials used to describe the optical wavefront deformations at least substantially vanish.

Then an algorithm computes the temperature distribution which is required in the first plate 44 to generate the phase variations determined before. In a next step it has to be determined where which amounts of heat which have to be exchanged between the first plate 44 and the gas jets, and how the gas inlet device 58 has to be controlled so as to obtain this heat exchange. This again may be achieved by using an optimization algorithm.

Finally, the control unit 84 controls the valves 76a, 76b and the actuators 82a, 82b so that the gas jets 86a, 86b impinge on the first plate at the locations and for time intervals as determined above.

V.

Alternative Embodiment

Figure 7:
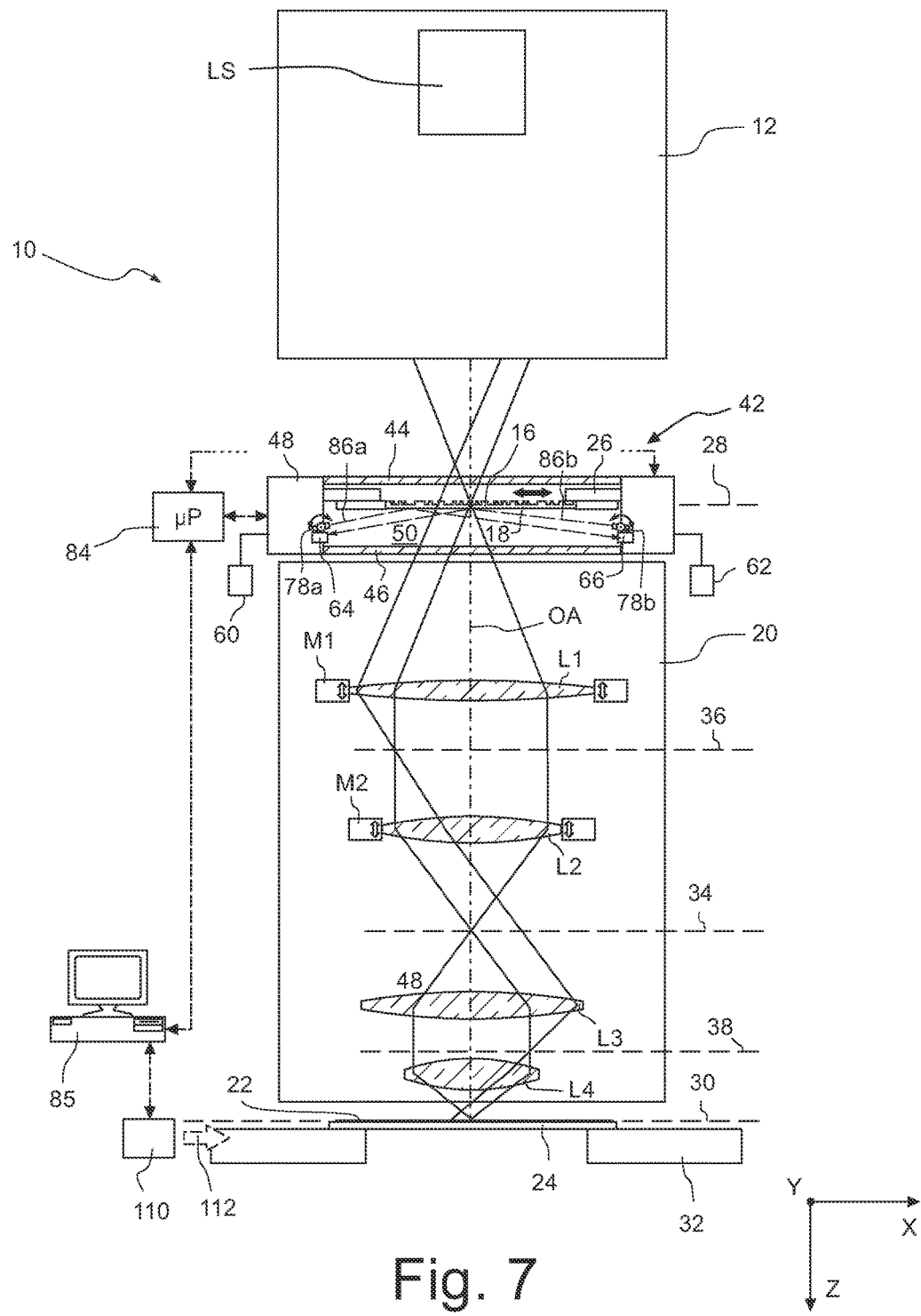
FIG. 7 is a schematic meridional section through the apparatus shown in FIG. 1 according to another embodiment of the optical wavefront manipulator in which the gas jets are directed on the mask to be imaged.

FIG. 7 is a schematic meridional section through an apparatus 10 comprising an optical wavefront manipulator 42 according to another embodiment. The cavity 50 is again confined by the two plates 44, 46 and the housing structure 48. In this embodiment, however, the cavity 50 accommodates the mask 16 and the mask stage 26, and the gas jets 86a, 86b are directed not on one of the plates 44, 46 confining the cavity 50, but on one side of the mask 16. Otherwise the configuration of the optical wavefront manipulator 42 is identical to the wavefront manipulator shown in FIG. 3.

Since the mask 16 is accommodated in the cavity 50 in which a pressure of less than 10 mbar, and preferably of less than $10^{-3}$ mbar, prevails, the mask 16 cannot stir a substantial amount of gas when it is quickly moved by the mask stage 26, as this is indicated in FIG. 7 by a double arrow. Therefore the mask movements cannot result in quickly changing refractive index distributions (schlieren) in the vicinity of the mask 16, as this may be the case in prior art apparatus in which the mask moves through an $N_2$ or an inert gas atmosphere at normal pressure. Furthermore, distortion and other field dependent aberrations can be very effectively corrected, because the mask 16 is arranged in a field plane.

As a matter of course, the apparatus 10 may also comprise two wavefront manipulators 42, namely a first one in a pupil plane 36 of the objective 20 as shown in FIG. 2, and a second one in a field plane as shown in FIG. 7. Then both field dependent and field independent wavefront aberrations can be partially corrected or at least changed in such a manner that they can be corrected more easily by other means.

VI.

Important Method Steps

Figure 8:
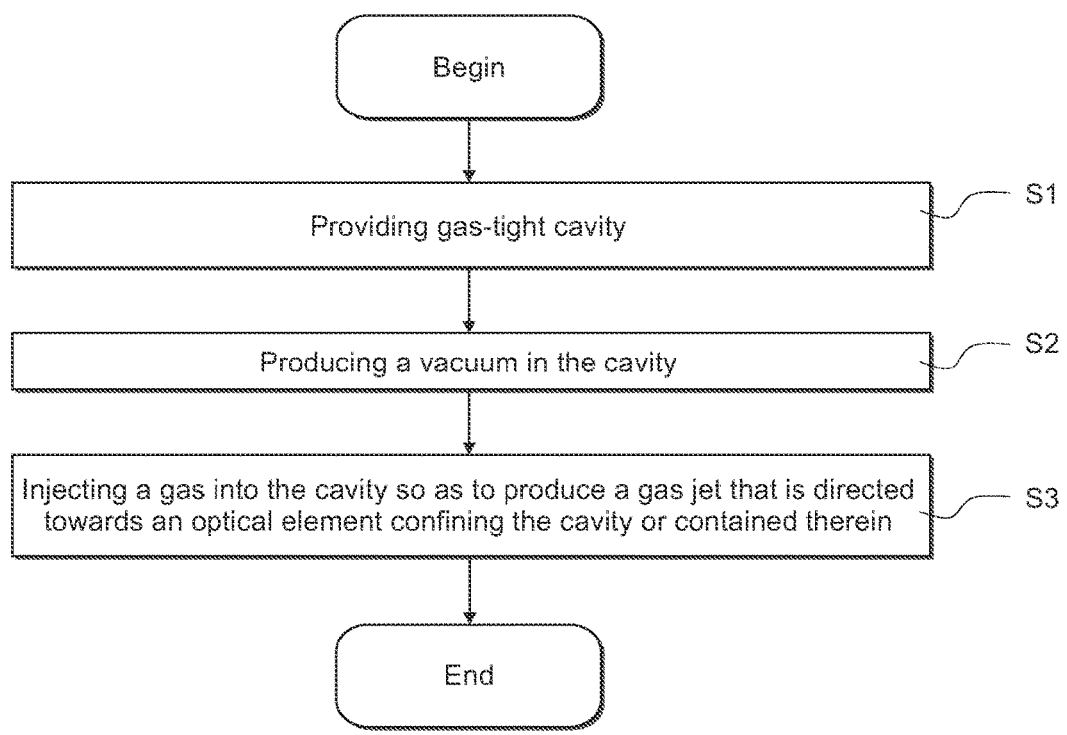
FIG. 8 is a flow diagram which summarizes important aspects of a method in accordance with the present invention.

FIG. 8 is a flow diagram which summarizes important aspects of a method of changing an optical wavefront in an objective of a microlithographic apparatus.

In a first step S1 an objective with a gas-tight cavity is provided.

In a second step S2 a vacuum is produced in the cavity.

In a third step S3 a gas is injected into the cavity so as to produce a gas jet that is directed towards an optical element confining the cavity or contained therein.

The invention claimed is:

1. An apparatus, comprising:
    a vacuum pump;
    an illumination system configured to produce projection light during operation of the illumination system to illuminate a mask with the projection light;
    a projection objective configured to use the projection light to image an illuminated portion of the mask onto a light-sensitive material;
    an optical wavefront manipulator, comprising:
        an optical element;
        a gas-tight cavity, the gas-tight cavity partly confined by the optical element or containing the optical element, the gas-tight cavity configured so that, during operation of the apparatus, the gas-tight cavity is in a light path of the projection light;
        a gas inlet device configured to direct a gas jet toward the optical element during use of the apparatus, a location where the gas jet impinges on the optical element after it has passed through the cavity being variable in response to a control signal supplied by a control unit; and
        a gas outlet in fluid connection with the vacuum pump so that, during operation of the vacuum pump, a pressure within the gas tight cavity is less than 10 mbar even when the gas jet passes through the gas-tight cavity; and
    a lens outside the gas-tight cavity and through which the projection light passes during operation of the apparatus,
    wherein the lens is in the projection objective, and the apparatus is a microlithographic apparatus.

2. The apparatus of claim 1, wherein the gas inlet device comprises a nozzle and an actuator configured to change: a) a position in response to the control signal;

and/or b) an orientation of the nozzle in response to the control signal.

3. The apparatus of claim 1, wherein:

the gas inlet device comprises a plurality of nozzles and a plurality of flow rate control devices;

each flow rate control device is associated with one of the nozzles; and each flow rate control device is configured to control the amount of gas that passes through the flow rate control device during operation of the gas inlet device.

4. The apparatus of claim 1, wherein the gas inlet device is configured to emit at least one supersonic free jet during operation of the gas inlet device.

5. The apparatus of claim 4, wherein the pressure within the cavity is less than $10^{-3}$ mbar even if the gas jet passes through the cavity during operation of the apparatus.

6. The apparatus of claim 1, wherein the gas inlet device comprises a Laval nozzle.

7. The apparatus of claim 1, wherein the pressure within the cavity is less than $10^{-3}$ mbar even if the gas jet passes through the cavity during operation of the apparatus.

8. The apparatus of claim 1, wherein the apparatus is a projection exposure apparatus which comprises a light source configured to produce a train of successive light pulses during operation of the light source.

9. The apparatus of claim 8, wherein the gas inlet device is configured so that, during operation of the gas inlet device, the gas inlet device produces a train of successive gas jets interleaved with the train of light pulses produced by the light source so that no light pulse impinges on any of the gas jets.

10. The apparatus of claim 1, wherein the apparatus comprises an objective configured to image a mask onto a surface during operation of the apparatus, and the optical element is a refractive optical element in the objective.

11. The apparatus of claim 1, wherein the optical element is a mask, and the apparatus comprises an objective configured to image the mask onto a surface during operation of the apparatus.

12. The apparatus of claim 1, wherein the optical wavefront manipulator is in the projection objective.

* * * * *

UNITED STATES PATENT AND TRADEMARK OFFICE
CERTIFICATE OF CORRECTION

PATENT NO. : 10,423,082 B2
APPLICATION NO. : 14/510368
DATED : September 24, 2019
INVENTOR(S) : Leonid Gorkhover Page 1 of 1

It is certified that error appears in the above-identified patent and that said Letters Patent is hereby corrected as shown below:

In the Specification

Column 4, Line 51, delete "comprisesa" and insert -- comprises --, therefor.

Column 6, Line 2, delete "kind" and insert -- kind. --, therefor.

Column 6, Line 8, delete "schlieren.In" and insert -- schlieren. In --, therefor.

Signed and Sealed this
Fourteenth Day of April, 2020

Andrei Iancu
*Director of the United States Patent and Trademark Office*